(12) United States Patent
Lo

(10) Patent No.: US 6,415,852 B1
(45) Date of Patent: Jul. 9, 2002

(54) HEAT SINK ASSEMBLY

(75) Inventor: Wei Ta Lo, Taipei (TW)

(73) Assignee: FoxConn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/758,789

(22) Filed: Jan. 11, 2001

(51) Int. Cl.[7] .................................................. F28F 7/00
(52) U.S. Cl. ....................... 165/80.3; 165/121; 361/697; 174/16.3; 257/722
(58) Field of Search ............................... 165/80.3, 185, 165/104.33, 122, 121; 361/697, 704, 710; 257/722; 174/16.3

(56) References Cited

U.S. PATENT DOCUMENTS

| | | | | | |
|---|---|---|---|---|---|
| 5,299,632 A | * | 4/1994 | Lee | ........................... | 165/80.3 |
| 5,421,402 A | * | 6/1995 | Lin | ........................... | 165/121 |
| 5,484,013 A | * | 1/1996 | Morikawa et al. | ......... | 174/16.3 |
| 5,495,392 A | * | 2/1996 | Shen | ........................... | 361/697 |
| 5,582,506 A | * | 12/1996 | Hong | ........................... | 165/80.3 |
| 5,584,339 A | * | 12/1996 | Hong | ........................... | 165/80.3 |
| 5,594,623 A | * | 1/1997 | Schwegler | ................... | 361/697 |
| 5,701,951 A | * | 12/1997 | Jean | ........................... | 165/185 |
| 5,724,228 A | * | 3/1998 | Lee | ........................... | 361/697 |
| 5,794,685 A | * | 8/1998 | Dean | ........................... | 165/121 |
| 5,835,347 A | * | 11/1998 | Chu | ........................... | 165/122 |
| 5,841,633 A | * | 11/1998 | Huang | ........................ | 174/16.3 |
| 6,302,189 B1 | * | 10/2001 | Lin et al. | ..................... | 165/121 |

* cited by examiner

Primary Examiner—Henry Bennett
Assistant Examiner—Terrell McKinnon
(74) Attorney, Agent, or Firm—Wei Te Chung

(57) ABSTRACT

A heat sink assembly (1) includes a heat sink (10), and a fan (20) attached to the heat sink. The fan is box-shaped, and defines two recesses (24) in each of two opposite side walls (22) thereof. The heat sink includes a base (12) and a plurality of parallel fins (14) extending upwardly therefrom. The fins include two engaging fins (16) at each of two opposite lateral sides of the heat sink. A wedge-shaped inside catch (18) is formed at a distal end of each engaging fin, for engaging with the corresponding recess of the fan. In assembly, the fan is pressed downwardly so that the engaging fins elastically deform, and the catches enter the recesses of the fan. Thus the fan is readily and securely attached to the heat sink. In an alternative embodiment, catches (18') of the heat sink (10') engage in through holes (26) of the fan.

8 Claims, 2 Drawing Sheets

HEAT SINK ASSEMBLY

BACKGROUND OF THE INVENTION

1. Field of the Invention

The present invention relates to a heat sink assembly, and particularly to a heat sink assembly which readily and firmly attaches a fan to a heat sink.

2. Related Art

During operation of an electronic device of a computer system, a large amount of heat is often produced. The heat must be quickly removed from the electronic device, to prevent the computer system from becoming unstable or being damaged. Typically, a heat sink is attached to an outer surface of the electronic device to facilitate removal of heat therefrom. A fan is often attached to the heat sink to provide forced convection therefrom.

A conventional means for attaching a fan to a heat sink is by using screws. During installation of the screws, however, there is a risk of accidental damage to fins of the heat sink in the vicinity of the screws. Furthermore, since the fins are generally flexible, the screws can become loose over time.

Thus an additional fixing device for attaching the fan to the heat sink is often used. However, the fixing device must first be attached to the heat sink, whereupon the fan is attached to the fixing device. This makes the assembly process unduly complicated, and decreases the efficiency of mass production. Moreover, the need for an additional fixing device increases costs.

Thus a heat sink assembly which overcomes the above problems of the related art is desired.

SUMMARY OF THE INVENTION

Accordingly, an object of the present invention is to provide a heat sink assembly which readily and firmly attaches a fan to a heat sink.

Another object of the present invention is to provide a heat sink assembly which has a simple configuration.

To achieve the above-mentioned objects, a heat sink assembly comprises a heat sink and a fan attached to the heat sink. The fan is box-shaped, and defines two recesses in each of two opposite side walls thereof. The heat sink comprises a base and a plurality of parallel fins extending upwardly therefrom. The fins comprise two engaging fins at each of two opposite lateral sides of the heat sink. A wedge-shaped inside catch is formed at a distal end of each engaging fin, for engaging with the corresponding recess of the fan. In assembly, the fan is pressed downwardly so that the engaging fins elastically deform. The catches then enter the recesses of the fan. Thus the fan is readily and securely attached to the heat sink.

In an alternative embodiment, a through hole is defined at each corner of the fan. In assembly, catches of the heat sink engage in the through holes of the fan.

Other objects, advantages and novel features of the present invention will be drawn from the following detailed description of preferred embodiments of the present invention with the attached drawings, in which:

DESCRIPTION OF THE PREFERRED EMBODIMENTS

Figure 1:
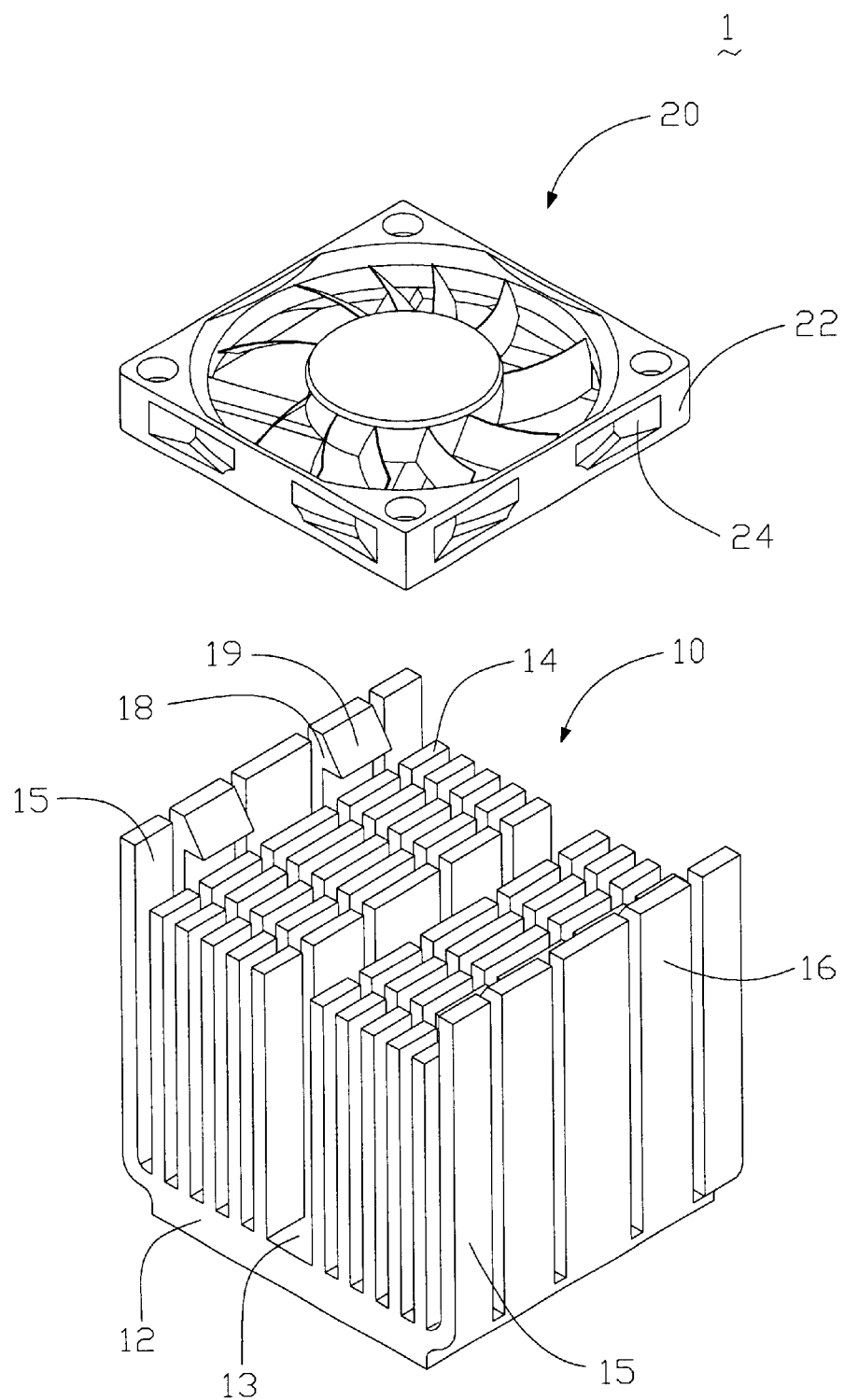
FIG. 1 is an exploded view of a heat sink assembly in accordance with a preferred embodiment of the present invention.

Referring to FIG. 1, a heat sink assembly 1 of the present invention includes a heat sink 10 and a fan 20. The fan 20 is box-shaped. Each of two opposite side walls 22 of the fan 20 defines two recesses 24 therein. A slanted inner surface 25 is formed on each side wall 22 at each recess 24.

The heat sink 10 includes a base 12 and a plurality of parallel fins 14 extending upwardly from the base 12. A slot 13 is defined through the fins 14 above a center of the base 12, for receiving a conventional clip (not shown) which attaches the heat sink assembly 1 to an electronic device (not shown). A row of alternate side fins 15 and engaging fins 16 is formed at each of two opposite lateral sides of the heat sink 10. The side fins 15 and engaging fins 16 extend higher than the fins 14, thereby defining a receiving space (not labeled) therebetween for receiving the fan 20. Each said row of alternate side fins 15 and engaging fins 16 comprises one pair of engaging fins 16, corresponding to the recesses 24 of the side wall 22 of the fan 20. A wedge-shaped inside catch 18 is formed at a distal end of each engaging fin 16. Each catch 18 has a sloped surface 19 for abutting against the corresponding slanted inner surface 25 of the fan 20. A distance between a pair of directly opposite engaging fins 16 at opposite sides of the heat sink 10 respectively is slightly less than a distance between the two opposite side walls 22 of the fan 20.

Figure 2:
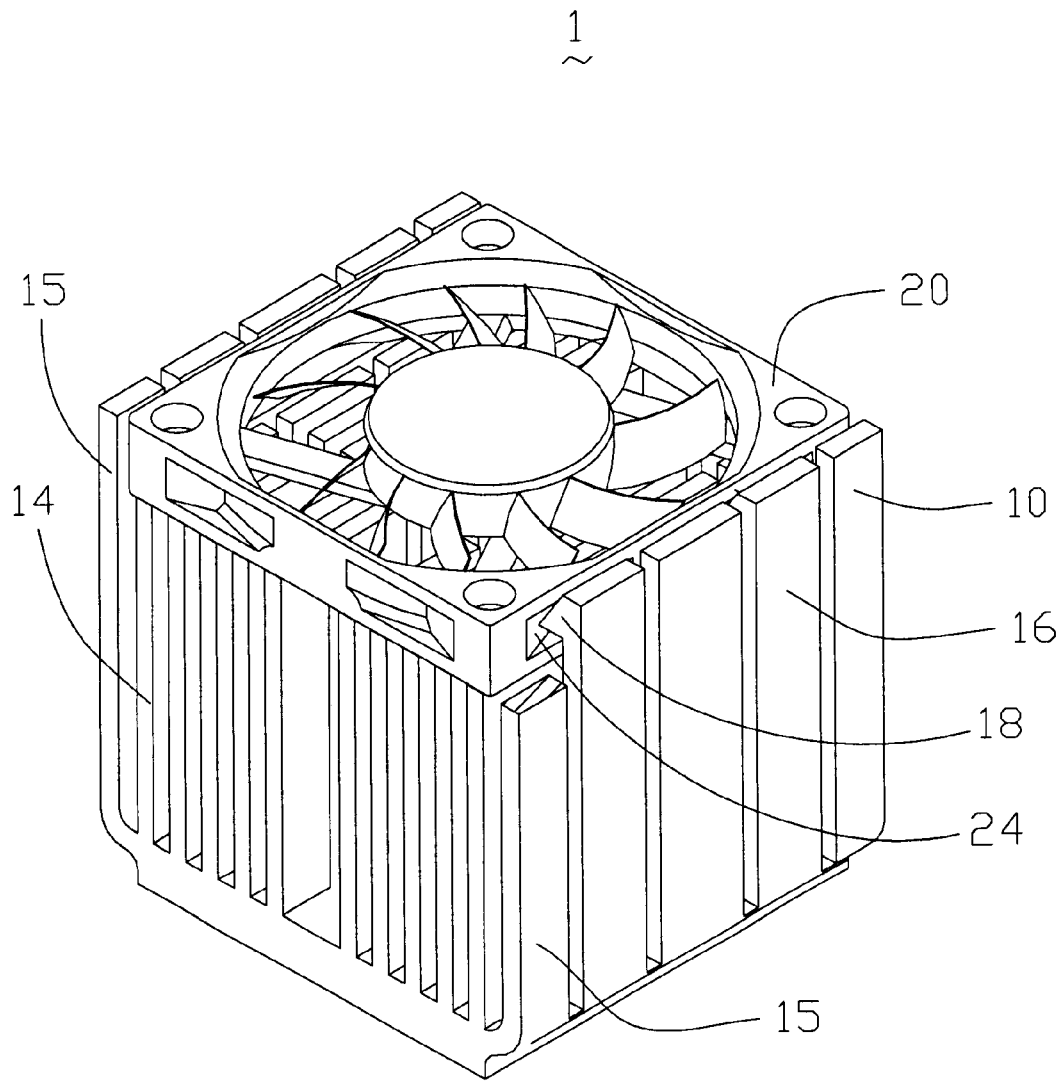
FIG. 2 is an assembled view of FIG. 1.

Referring also to FIG. 2, in assembly, the clip (not shown) is accommodated in the slot 13 of the heat sink 10. The fan 20 is placed on the heat sink 10, with the side walls 24 of the fan 20 abutting against the sloped surfaces 19 of the catches 18 of the heat sink 10. The fan 20 is pressed downwardly. The engaging fins 16 elastically deform, and the catches 18 enter the corresponding recesses 24 of the fan 20. The sloped surface 19 of each catch 18 interferentially abuts against the corresponding slanted inner surface 25 of the fan 20. The side walls 22 of the fan 20 interferentially abut against the side fins 15 and the engaging fins 16 of the heat sink 10. Thus the fan 20 is readily and securely retained in the receiving space (not labeled) of the heat sink 10.

The engagement of the catches 18 of the heat sink 10 in the recesses 24 of the fan 20 prevents the fan 20 from moving in a direction parallel to the lateral sides of the heat sink 10. The interferential abutment of the sloped surfaces 19 of the catches 18 against the slanted inner surfaces 25 of the fan 20 further prevents the fan 20 from moving relative to the heat sink 10.

The simple configuration of the heat sink assembly 1 accordingly simplifies the assembly process.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat sink assembly comprising:

a heat sink comprising a base and a plurality of fins extending upwardly from the base, each of two opposite sides of the heat sink having at least one engaging fin, each engaging fin forming a catch thereon; and a fan attached to the heat sink, the fan defining at least one receiving portion, each receiving portion receiving one corresponding catch of the heat sink; wherein a row of fins including the at least one engaging fin at each of two opposite sides of the heat sink extends higher than other fins, thereby defining a space for receiving the fan therein, and wherein said row of fins includes alternate engaging fins and side fins.

2. The heat sink assembly as described in claim 1, wherein a slot is defined in the heat sink, for receiving a clip therein and for thereby attaching the heat sink to a heat-generating electronic device.

3. The heat sink assembly as described in claim 1, wherein a distance between a pair of directly opposite engaging fins at opposite sides of the heat sink respectively is slightly less than a distance between two opposite side walls of the fan.

4. The heat sink assembly as described in claim 1, wherein the engaging fins and the side fins interferentially abut against the side walls of the fan.

5. The heat sink assembly as described in claim 1, wherein at least one receiving portion of the fan comprises a recess defining at one side wall of the fan.

6. The heat sink assembly as described in claim 1, wherein each catch is wedge-shaped, and is formed at a distal end of the corresponding engaging fin, a sloped surface of each catch interferentially abutting against a slanted inner surface of the fan at the corresponding recess of the fan.

7. A heat sink assembly comprising:

a heat sink comprising a base and a plurality of fins, each of two opposite sides of the heat sink having at least one engaging fin;

a fan attached to the fins and secured between the engaging fins; and means for fixing the fan to the heat sink, the means comprising a catch at a distal end of each engaging fin, each catch having a sloped surface, and a recess at each of two opposite sides of the fan for engagement of the catch, wherein the sloped surface of the catch abuts against a slanted surface of the recess.

8. A heat sink assembly comprising:

a heat sink comprising a base and a plurality of fins, each of two opposite sides of the heat sink having at least one engaging fin;

a fan attached to the fins and secured between the engaging fins; and means for fixing the fan to the heat sink, the means comprising a catch at a distal end of each engaging fin, each catch having a sloped surface, the means further comprising a through hole at each corner of the fan for engagement of the catch.

* * * * *